United States Patent [19]

Karpman

[11] Patent Number: 4,825,337
[45] Date of Patent: Apr. 25, 1989

[54] CIRCUIT BOARD THERMAL CONTACT DEVICE

[75] Inventor: Maurice S. Karpman, Westwood, Mass.

[73] Assignee: Prime Computer, Inc., Natick, Mass.

[21] Appl. No.: 194,830

[22] Filed: May 17, 1988

[51] Int. Cl.$^4$ .............................................. H05G 7/20
[52] U.S. Cl. .................................... 361/386; 165/185; 174/16.3; 357/79; 357/81; 361/388
[58] Field of Search ............................. 165/80.3, 185; 174/16 HS; 357/79, 81; 361/381, 383, 386–389

[56] References Cited

U.S. PATENT DOCUMENTS 4,408,220 10/1983 Calabro ........................ 174/16 HS
4,442,450 4/1984 Lipschutz et al. .................. 361/389
4,479,140 10/1984 Horvath ........................... 357/79

Primary Examiner—A. D. Pellinen
Assistant Examiner—Gregory D. Thompson
Attorney, Agent, or Firm—Wolf, Greenfield & Sacks

[57] ABSTRACT

A variable thickness intermediate cooling member adapted to be disposed between a circuit board having electronic module or packages mounted thereon and a cold plate providing thermal coupling between the cold plate and the circuit board. The intermediate cooling member is comprised of a foldable heat conductive member having a manually operable handle for moving the member between a maximum thickness circuit board engaging position to provide thermal contact, and a minimum thickness circuit board disengaging position to enable access to the circuit board.

32 Claims, 3 Drawing Sheets

CIRCUIT BOARD THERMAL CONTACT DEVICE

BACKGROUND OF THE INVENTION

1. Field of the Invention

The present invention relates in general to a thermal contact device for use with a circuit board to permit thermal coupling of an electronic package or module to a cold plate. More particularly, the present invention relates to a thermal contact device that permits such thermal coupling while furthermore readily enabling mechanical decoupling of the circuit board.

2. Background Discussion

In certain circuit board environments, particularly in the data processing and computer field, there are circuit boards that are considered to be high temperature boards that require thermal cooling. In such high temperature boards, it is desirable to provide a cold plate in physical contact with a populated board for cooling purposes. It is typical to provide both the board (also conventionally referred to as a mother board) and the cold plate in a rigidly connected arrangement. However, with such an arrangement it is cumbersome and time consuming to replace boards in the field.

Accordingly, it is an object of the present invention to provide an intermediate thermal contact device adapted to be mounted between a populated circuit board and a cold plate to permit thermal coupling between the circuit board and the cold plate while at the same time allowing for ease of field replaceability of the circuit board.

Another object of the present invention is to provide a circuit board thermal contact device that has enhanced vibration damping characteristics.

A further object of the present invention is to provide a thermal contact device for a circuit board in which the device has a variably controlled thickness so as to accommodate populated circuit boards of various height.

SUMMARY OF THE INVENTION

To accomplish the foregoing and other objects, features and advantages of the invention there is provided a circuit board thermal contact device in the form of a variable thickness intermediate cooling device adapted to be mounted between a circuit board that has electronic modules or packages mounted thereon, and a cold plate. As indicated, the variable thickness intermediate coupling device or member is disposed between the circuit board and the cold plate for thermally intercoupling therebetween. The intermediate cooling member is comprised of a foldable heat conductive member having a manually operable handle for moving the member between opposite positions including a maximum thickness position thereof wherein there is thermal contact from the cold plate to the circuit board modules or packages, and a minimum thickness position for providing an accommodating space between the cold plate and the circuit board modules or packages so as to enable access to the circuit board for replacement or other purposes. The foldable heat conductive member in one embodiment is comprised of top and bottom plates intercoupled by hinge means coupled therebetween. The hinge means is comprised of plurality of struts having pivot joints at ends at the respective top and bottom plates. The handle may include a pull rod intercoupling the struts, so that the struts fold in unison to maintain the top and bottom plates essentially in parallel in both engaging and disengaging positions thereof. The top and bottom plates are spaced at a maximum distance when in the circuit board engaging position and are spaced a closer distance so that the bottom plate is spaced from the circuit board when in the disengaging position thereof. Means may be provided for securing the top plate of the foldable heat conductive member to the cold plate. In an alternate embodiment of the invention the foldable heat conductive member is operable for thermal coupling with the circuit board by engagement therewith as the circuit board is slid into the back-plane system.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

The present invention, as illustrated, is in the form of a foldable heat conductive member which functions as an intermediate structure sandwiched between a populated mother board and a cold plate. The arrangement allows for the thermal coupling of the mother board to the cold plate. This intermediate structure also allows for ease of field replaceability because the mother board and cold plate are now not rigidly interconnected. This intermediate structure is in the form of a foldable heat conductive member including hinge means in the preferred form of struts which pivot to readily enable boards to be slid in and out of the back-plane system.

The advantages of the present invention, aside from field replaceability also include vibration/damping enhancement nd thickness control which allows closer contact and custom design to accommodate populated boards of varying height.

Figure 1:
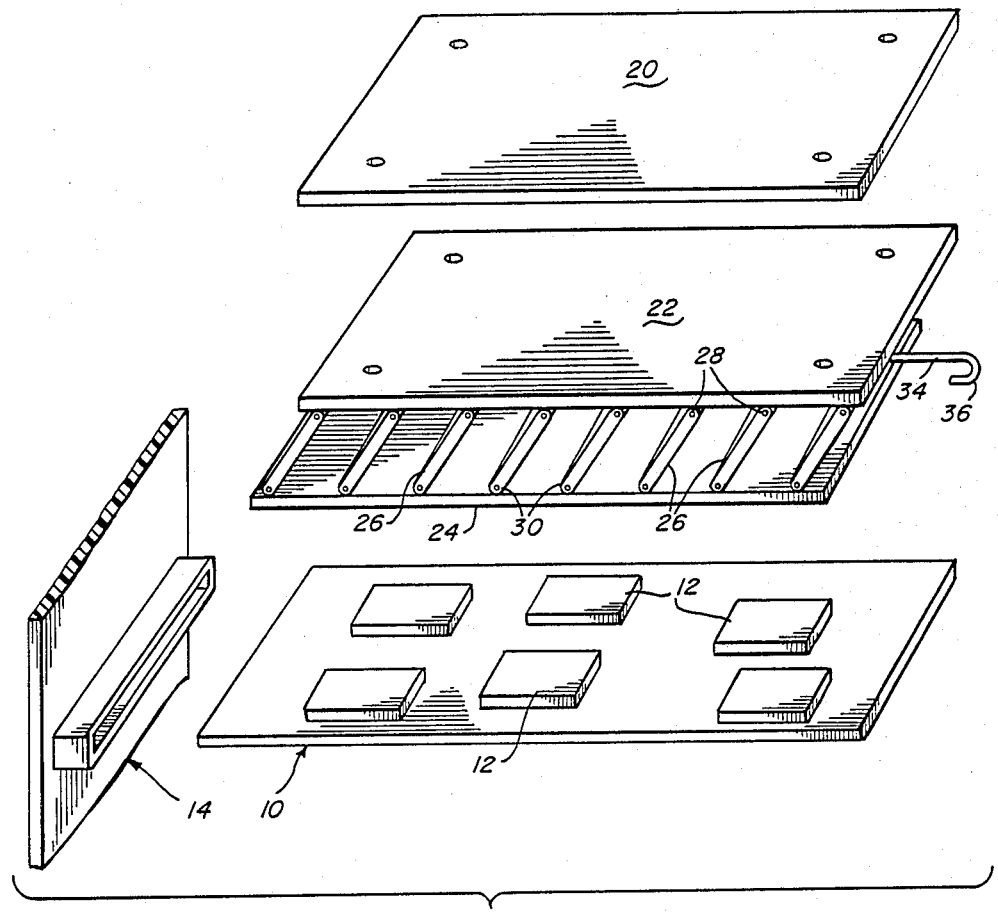
FIG. 1 is an exploded perspective view illustrating the elements of the present invention.
Figure 2:
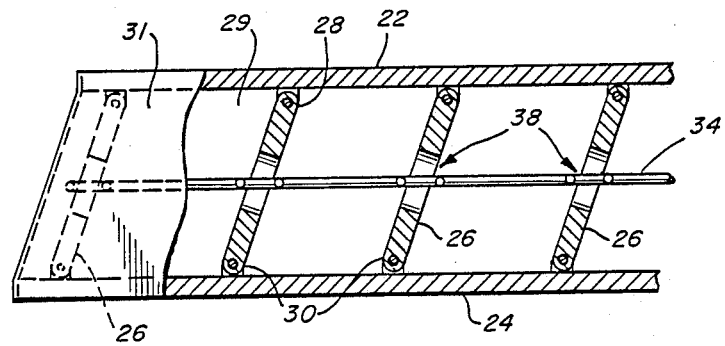
FIG. 2 is a fragmentary view of an alternate construction and mostly in cross-section through a portion of the foldable heat conductive member of the present invention.
Figure 3:
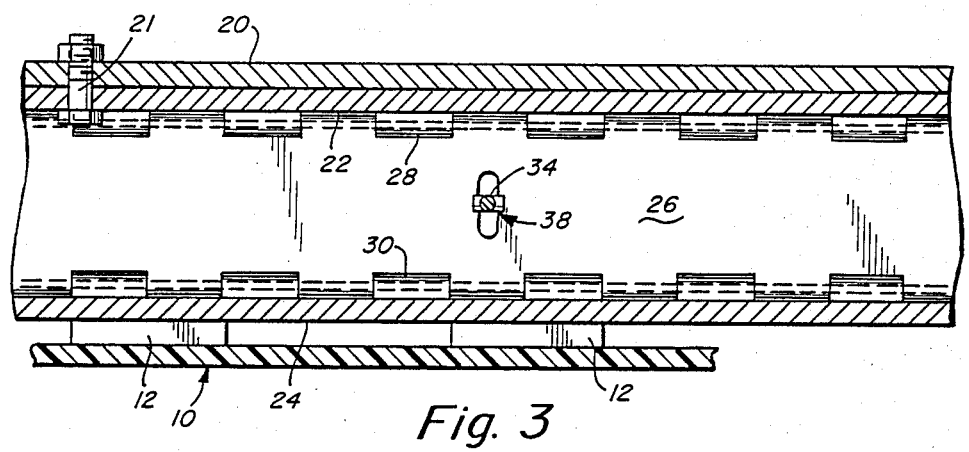
FIG. 3 is a fragmentary transverse cross-sectional view through the foldable heat conductive member of the present invention such as in the embodiment of FIG. 1 and furthermore illustrating a means for securing the member to the cold plate.

Referring now to the drawings and in particular to FIGS. 1-3, there is illustrated a circuit board 10 schematically illustrated as having mounted thereon electronic packages or modules 12. The circuit board 10 illustrated in FIG. 1 is for insertion into a back-plane as illustrated at 14. FIG. 1 also illustrates the cold plate 20.

The cold plate 20 is a heat conductive plate and preferably of metal. The circuit board 10, of course, is a conventional circuit board made of an insulating dielectric material.

The foldable heat conductive member in accordance with the present invention is comprised of a top plate 22 and a bottom plate 24, both of which may be of metal construction. These plates may be of like dimension and thickness. The plates 22 and 24 are interconnected by a hinge member that is comprised of a plurality struts 26 that intercouple between the respective plates 22 and 24. For this purpose there are provided hinges 28 and 30 as illustrated in FIGS. 1-3. The hinge 28 connects the top of the strut 26 to the plate 22. The hinge 30 connects the bottom of each strut 26 to the bottom plate 24. The hinges or joints 28 and 30 may, in themselves be of conventional design. It is noted in, for example, FIGS. 1 and 2 that there are a plurality of such struts 26 each having corresponding top and bottom hinges 28 and 30. The struts are arranged with their associated hinges so that the struts are all maintained in a parallel array regardless of the particular position of the foldable heat conductive member.

FIGS. 1-3 also illustrate the pull rod 34 that is used for manually actuating the foldable heat conductive member. The pull rod 34 has, at its external exposed end an operating handle 36 as illustrated in FIG. 1. The pull rod 34 is secured in a similar manner to each of the struts 26. In this connection refer to FIG. 2 and the connection at joint 38. The joint at 38 permits the struts 26 to fold relative to the pull rod. In one embodiment in accordance with the invention the connection at 38 at the intermediate struts may be formed by simply providing a hole in the strut 26 as illustrated in substance in FIG. 3.

The foldable heat conductive member illustrated in the drawings is constructed of a heat conductive material, preferably a metal. The pull rod 34 as well as the struts 26 are also preferably constructed of a metal. The struts 26 may be constructed of either a rigid metal or preferably of a flexible metal so that when the foldable heat conductive member is moved to its circuit board engaging position it has the capability of a limited amount of flexing to accommodate to the circuit boards and associated electronic packages or modules of different height and configuration. This flexing may be carried out primarily by means of the use of flexible struts 26. However, it is understood that the struts 26 still have sufficient stiffness to maintain a tight and intimate contact, in the circuit board engaging position of the heat conducting member, so as to provide proper heat conductivity between the cold plate and the mother board.

In a preferred embodiment of the present invention the foldable heat conductive member is secured to the cold plate 20. In this regard FIG. 3, by way of illustration, shows one of a series of bolts 21 that may be employed for clamping the heat conductive member to the cold plate 20. More particularly, FIG. 3 shows the bolt securing the cold plate 20 to the top plate 22 of the foldable heat conductive member.

The fragmentary view of FIG. 2 is also for the illustration of the an alternate embodiment of the invention in which the spaces at 29 between the struts is filled with a compressible, thermally conductive material such as a compressible thermally conductive gel. The spaces 29 may also be filled with a fluid, air or a liquid. In connection with the use of any type of fluid or the above mentioned gel, it is noted that the foldable heat conductive member is thus constructed to provide an encased space. In this regard refer in FIG. 2 to the side wall 31. It is furthermore to be noted that the side wall 31 is constructed of a pliable material so as to permit the folding of the variable thickness heat conductive member of the invention.

Figure 4:
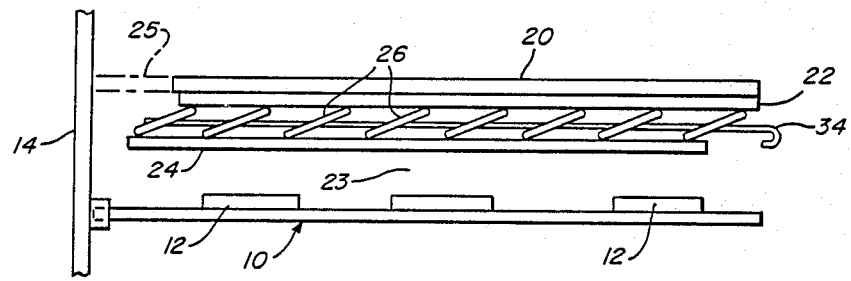
FIG. 4 is a schematic diagram illustrating the foldable heat conductive member in its disengaged position.
Figure 5:
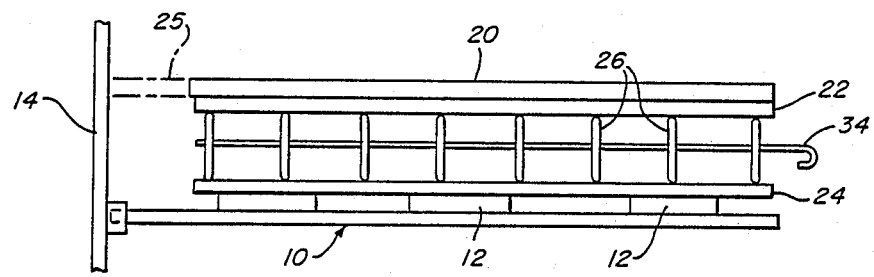
FIG. 5 is a schematic diagram illustrating the foldable heat conductive member in its engaged position.

Reference is now made to FIGS. 4 and 5 to show the respective disengaged an engaged positions of the foldable heat conductive member of the present invention. FIG. 4 shows the intermediate coupling member in its disengaged position. It is noted in FIG. 4 that the struts 26 are shown folded so that the plates 22 and 24 are in relatively close proximity to each other. FIG. 4 also illustrates the space at 23. The member is moved to this disengaged position by operation of the pull rod 34. In this position the pull rod 34 is moved toward the plates 22 and 24. The space 23 permits ready removal of the circuit board 10 without requiring any disconnections between the cold plate and circuit board.

As indicated previously, FIG. 5 illustrates the foldable heat conductive member of the invention in its engaged position. The pull rod 34 has been moved away from the plates 22 and 24 so as to expand the member to place the plates 24 in firm engagement with the modules 12 and circuit board 10. In FIG. 5 it is noted that the struts 26 are now shown in their unfolded position extending substantially in a direction normal to the plates 22 and 24. As indicated previously, the struts 26 are also provided with a certain amount of flexibility so that if larger modules, for example, are employed then the struts 26 may flex or bow slightly so as to accommodate the different size or configuration circuit boards and associated modules or packages.

It is noted in FIGS. 4 and 5, that the cold plate 20 is illustrated by dotted outline at 25 as having a coupling relationship to the back-plane 14 where the cold plate 20 may also be supported in some other manner, and is preferably in fixed position so that it is fixed in position, in particular, relative to the circuit board 10. Thus in this embodiment it is only the variable thickness foldable heat conductive member that is movable to be urged into and out of engagement with the circuit board modules.

Figure 6:
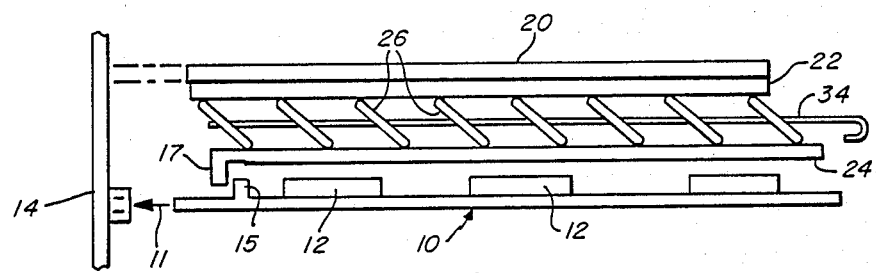
FIG. 6 is a schematic diagram of an alternate embodiment of the invention in which the circuit board itself has means for engaging the foldable heat conductive member to move the member into engaging thermal contact with the electronic packages or modules on the circuit board.

FIG. 6 illustrates an alternate embodiment of the invention. In FIG. 6 the same reference characters are employed to identify like parts previously described in connection with FIGS. 1-5. This embodiment is one in which, upon insertion of the circuit board 10, such as in the direction of the arrow 11, the circuit board itself actually actuates the foldable heat conductive member. In this regard, it is noted that this is carried out by virtue of the circuit board 10 being provided with a post 15 or the like that is adapted to engage tab 17 or the like associated with the bottom plate 24 of the foldable heat conductive member. In FIG. 6 the member is shown in a partially folded position.

When the circuit board 10 is inserted to engage in the back-plane 14, the post 15 engages tab 17 and moves the bottom plate 24 to a position of engagement with the modules, such engagement being of the type illustrated in FIG. 5. The position of the post 15 and the tab 17 is arranged so that the engagement may occur just as the circuit board 10 is starting to be engaged in the back-plane. As the circuit board is pushed in further into the back-plane into its final resting position then the engagement of the post 15 with the tabs 17 would move the foldable heat conductive member into firm thermal engaging contact with the modules of the circuit board 10.

It is noted in FIGS. 1-5 that the struts 26 are foldable in one predetermined direction. In FIG. 6 the struts 26 are foldable in the opposite predetermined direction. For the purpose of automatic actuation of the foldable heat conductive member, the struts 26 are to be in the position illustrated in FIG. 6. In the drawings there has been illustrated a cold plate 20. This cold plate 20 may be of conventional design having means for coupling to a heat exchanger for maintaining the cold plate at proper temperature for proper thermal coupling.

Figure 7:
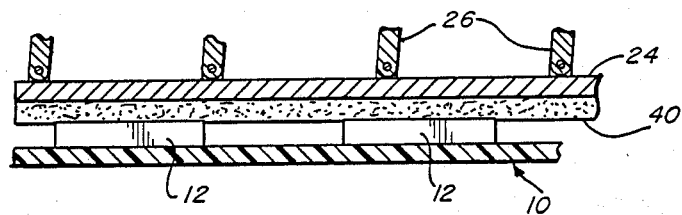
FIG. 7 a fragmentary view illustrating an alternate construction in accordance with the present invention employing a compressable thermal member.

Reference is now made to the fragmentary view of FIG. 7 for an alternate construction in accordance with the present invention. FIG. 7 shows the circuit board 10 and modules 12 with the heat conductive member shown in its circuit board engaging position. There is illustrated, in particular, in FIG. 7 the bottom plate 24 and struts 26.

In accordance with this alternate embodiment of the invention there is furthermore included a thin layer 40 attached to the underside of the bottom plate 24 of the foldable heat conductive member. The layer 40 is of a compressable and preferably resilient thermally conductive material. This may be of a thermal grease or a compressable thermally conductive gel attached to the bottom surface of the bottom plate. The layer 40, as previously indicated, is thermally conductive and is preferably in the form of a separate integral layer subsequently attached to the plate 24 and having the aforementioned desired compliance and resiliency.

The layer 40 serves to enhance the thermal contact between the modules on the circuit board and the bottom plate of the device. A further advantage of the layer 40 is the capability of the layer compensating for small differences in the height of the modules on any given circuit board.

Having now described a limited number of embodiments of the present invention, it should become apparent to those skilled in the art that numerous other embodiments and modifications thereof are contemplated as falling within the scope of the present invention as defined by the appended claims.

What is claimed is:

1. In combination, a circuit board means including a circuit board and electronic modules or packages mounted thereon, a cold plate for thermally coupling with said circuit board means, and a variable thickness intermediate coupling member disposed between said circuit board and said cold plate for thermally intercoupling therebetween, said intermediate cooling member comprised of a foldable heat conductive member having a manually operable handle for moving said member between a maximum thickness circuit board means engaging position to provide thermal contact, and a minimum thickness circuit board means disengaging position to enable access to said circuit board means.

2. The combination as set forth in claim 1 wherein said foldable heat conductive member is comprised of top and bottom plates intercoupled by hinge means coupled therebetween.

3. The combination as set forth in claim 2 wherein said hinge means comprises a plurality of struts having pivot joints at ends at respective top and bottom plates.

4. The combination as set forth in claim 3 wherein said handle includes a pull rod intercoupling all struts so that the struts fold in unison maintaining the top and bottom plates in parallel in both engaging and disengaging positions.

5. The combination as set forth in claim 3 wherein the top and bottom plates are spaced a maximum distance when in the engaging position and are spaced a minimum distance so that the bottom plate is spaced from the circuit board means when in the disengaging position.

6. The combination as set forth in claim 5 including means for securing the top plate of the foldable heat conductive member to said cold plate.

7. The combination as set forth in claim 6 wherein said handle includes a pull rod intercoupling all struts so that the struts fold in unison maintaining the top and bottom plates in parallel in both engaging and disengaging positions.

8. The combination as set forth in claim 1 wherein said foldable heat conductive member has a compressable thermally conductive layer disposed thereon for contact with the electronic modules or packages mounted on the circuit board in the circuit board means engaging position.

9. The combination as set forth in claim 8 wherein said compressable thermally conductive layer is comprised of a thermal grease.

10. The combination as set forth in claim 8 wherein said compressable thermally conductive layer comprises a resilient thermally conductive gel.

11. In combination, a circuit board having electronic modules or packages mounted thereon, a cold plate for thermally coupling with said circuit board, and a variable thickness intermediate cooling member disposed between said circuit board and said cold plate for thermally intercoupling therebetween, said intermediate cooling member comprised of a foldable heat conductive member having a manually operable handle for moving said member between opposite positions including a maximum thickness position wherein there is thermal contact from the cold plate to the circuit board modules or packages.

12. The combination as set forth in claim 11 wherein said foldable heat conductive member is comprised of top and bottom plates intercoupled by hinge means coupled therebetween.

13. The combination as set forth in claim 12 wherein said hinge means comprises a plurality of struts having pivot joints at ends at respective top and bottom plates.

14. The combination as set forth in claim 13 wherein said handle includes a pull rod intercoupling all struts so that the struts fold in unison maintaining the top and bottom plates in parallel in both engaging and disengaging positions.

15. The combination as set forth in claim 14 wherein the top and bottom plates are spaced a maximum distance when in the engaging position and are spaced a minimum distance so that the bottom plate is spaced from the circuit board when in the disengaging position.

16. The combination as set forth in claim 15 including means for securing the top plate of the foldable heat conductive member to said cold plate.

17. The combination as set forth in claim 16 wherein said handle includes a pull rod intercoupling all struts so that the struts fold in unison maintaining the top and bottom plates in parallel in both engaging and disengaging positions.

18. The combination as set forth in claim 11 wherein said foldable heat conductive member has a compressable thermally conductive layer disposed thereon for contact with the electronic modules or packages mounted on the circuit board in a circuit board engaging position.

19. The combination as set forth in claim 18 wherein said compressable thermally conductive layer is comprised of a thermal grease.

20. The combination as set forth in claim 18 wherein said compressable thermally conductive layer is comprises a resilient thermally conductive gel.

21. An intermediate cooling member adapted to be disposed between a circuit board having electronic modules or packages mounted thereon and a cold plate for thermally coupling with the circuit board, said intermediate cooling member comprising a foldable heat conductive member including a foldable hinge means having one and another sides, means at the one side of said foldable hinge means for securing said foldable hinge means to said cold plate, and plate means at the other side of said foldable hinge means for providing intimate thermal contact with electronic modules or packages on said circuit board.

22. An intermediate cooling member as set forth in claim 21 wherein said hinge means has a manually operable handle for moving said hinge means between a maximum thickness circuit board engaging board position to provide thermal contact and minimum thickness circuit board disengaging position to enable access to said circuit board.

23. An intermediate cooling member as set forth in claim 22 wherein said foldable heat conductive member comprised top and bottom plates, said top plate secured to said cold plate, and wherein hinge means comprises a plurality of struts having pivot joints at ends at respective top and bottom plates.

24. An intermediate cooling member as set forth in claim 23 wherein said handle includes a pull rod intercoupling all struts so that the struts fold in unison maintaining the top and bottom plates in parallel in both engaging and disengaging positions.

25. An intermediate cooling member as set forth in claim 24 wherein the top and bottom plates are spaced a maximum distance when in the engaging position and are spaced a minimum distance so that the bottom plate is spaced from the circuit board when in the disengaging position.

26. An intermediate cooling member as set forth in claim 21 wherein said circuit board and plate mean have cooperating intercoupling means for urging said foldable hinge means from an at least partially folded position to a position in which the plate means is in intimate thermal contact with the circuit board.

27. An intermediate cooling member as set forth in claim 26 wherein the foldable hinge means is in its intimate contact position only when the circuit board is fully in its inserted at rest position.

28. An intermediate cooling member as set forth in claim 26 wherein said cooperating intercoupling means comprises a post on the circuit board and an associated tab on the plate means.

29. An intermediate cooling member as set forth in claim 21 wherein said foldable heat conductive member has a compressable thermally conductive layer disposed thereon for contact with the electronic modules or packages mounted on the circuit board in a circuit board engaging position.

30. An intermediate cooling member as set forth in claim 29 wherein said compressable thermally conductive layer is comprised of a thermal grease.

31. An intermediate cooling member as set forth in claim 29 wherein said compressable thermally conductive layer comprises a resilient thermally conductive gel.

32. In combination, a circuit board having electronic modules or packages mounted thereon, a cold plate for thermally coupling with said circuit board, and a variable thickness intermediate cooling member disposed between said circuit board and said cold plate for thermally intercoupling therebetween, said intermediate cooling member comprised of a foldable heat conductive member including a hinge means and plate means, said plate means for direct thermal contact with said circuit board, said plate means and circuit board having mutually operable intercoupling means for moving said foldable heat conductive member from an at least partially folded position to a thermally engaging position upon insertion of said circuit board into a back plane.

* * * * *